(12) United States Patent
Rennig

(10) Patent No.: US 6,778,014 B2
(45) Date of Patent: Aug. 17, 2004

(54) CMOS DIFFERENTIAL AMPLIFIER

(75) Inventor: Fred S. Rennig, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 10/374,472

(22) Filed: Feb. 25, 2003

(65) Prior Publication Data

US 2003/0160657 A1 Aug. 28, 2003

(30) Foreign Application Priority Data

Feb. 25, 2002 (DE) ........................................ 102 07 802

(51) Int. Cl.[7] .............................................. H03F 3/45
(52) U.S. Cl. ........................ 330/253; 330/255; 327/359
(58) Field of Search ................................ 330/253, 255, 330/258, 261; 327/359

(56) References Cited

U.S. PATENT DOCUMENTS 4,958,133 A * 9/1990 Bazes .......................... 330/253
6,043,708 A * 3/2000 Barr ............................ 330/253
6,496,066 B2 * 12/2002 Colonna et al. ............. 330/253

OTHER PUBLICATIONS

"Robust Design of Rail-to-Rail CMOS Operational Amplifiers for a Low Power Supply Voltage," IEEE Journal of Solid-State Circuits, vol. 31, No. 2, Feb. 1996, pp. 146–156 (Satoshi Sakurai).

* cited by examiner

Primary Examiner—Henry Choe
(74) Attorney, Agent, or Firm—Warren L. Franz; W. James Brady; Frederick J. Telecky, Jr.

(57) ABSTRACT

A Complementary CMOS differential amplifier has automatic operating point adjustment (self-biasing) and the properties of a rail-to-rail amplifier. The CMOS differential amplifier uses folded cascodes and is considerably faster in operation than previous CMOS differential amplifiers, since it comprises a circuit element that ensures that, during the operation of the CMOS differential amplifier, all MOS FETs of the cascodes operate in their saturation range (that is not in their resistive range). The CMOS differential amplifier may be used in an input stage, a signal distribution circuit and a clock pulse distribution circuit.

10 Claims, 2 Drawing Sheets

CMOS DIFFERENTIAL AMPLIFIER

CROSS-REFERENCE TO RELATED APPLICATIONS

This application claims priority under 35 U.S.C. 119 of German Patent Application Number 10207802.5, filed Feb. 25, 2002.

FIELD OF THE INVENTION

The invention relates to an improved CMOS differential amplifier.

BACKGROUND OF THE INVENTION

A CMOS differential amplifier of the type to which the present invention relates is described in Bazes U.S. Pat. No. 4,958,133, the entirety of which is incorporated herein by reference. A further description of the same amplifier is found in Mel Bazes, "Two Novel Fully Complementary Self-Biased CMOS Differential Amplifiers," IEEE Journal of Solid-State Circuits, Vol. 26, No. 2, February 1991, the entirety of which is also incorporated herein by reference. Such amplifier may, for example, be used as an input stage of a clock pulse distribution circuit.

The CMOS differential amplifier of Bazes is shown FIG. 1. It is a rail-to-rail amplifier where an in-phase control between the negative and the positive operating voltages is achieved by relieving the loads of two conventional mutually complementary CMOS folded-cascode differential amplifiers connected to each other. In the Bazes arrangement, the voltages are applied to the gate connections of the cascode transistors (MP3, MP5, MN5, MN3, MP4, MP6, MN6, MN4 in FIG. 1) using a self-biasing arrangement, wherein the voltages present at the drain connections of the second PMOS FET (MP5) and the first NMOS FET (MN5) are fed back to the gates of the eight cascode transistors MP3, MP5, MN5, MN3, MP4, MP6, MN6 MN4. This serves to make the bias voltage less dependent of process changes and changes in the temperature and operating voltage.

The CMOS differential amplifier developed by Bazes has the disadvantage that it is not suited for processing very fast signals (for example, in the 1 GHz range) of the type which can be encountered, for example, in clock pulse distribution circuits using CMOS differential amplifiers in their input stages needed to satisfy present-day market requirements. This is largely due to the fact that the cascode transistors connected to the voltage potentials—that is, the first PMOS FET (MP3), the third PMOS FET (MP4), the second NMOS FET (MN3) and the fourth NMOS FET (MN4)—cannot operate in their saturation condition, but only within their resistive range. This means that these four MOS FETs must be of relatively large dimensions, using a relatively large circuit space—a further disadvantage of such conventional CMOS differential amplifiers.

SUMMARY OF THE INVENTION

The invention provides an improved CMOS differential amplifier of the type described above, whose operation is considerably faster and which, therefore, is particularly suited to applications in clock pulse distribution circuits that can process frequencies in the 1 GHz range, and which furthermore occupies a smaller circuit area, since the transistors are used in a more efficient way.

In accordance with one aspect of the invention, a CMOS differential amplifier is provided with a circuit element whose purpose is to generate at the gate connection of the second PMOS FET a voltage that is at least as much below the gate voltage of the first PMOS FET to allow this to operate within its saturation region, and to generate at the gate connection of the first NMOS FET a voltage that is at least as much above the gate voltage of the second NMOS FET to allow this to operate within its saturation region.

In a preferred embodiment, this circuit element comprises two voltage potential dividers which enable all the cascode transistors (that is, also the first PMOS FET MP3, the third PMOS FET MP4, the second NMOS FET MN3 and the fourth NMOS FET MN4) to operate within their saturation region, whereby the current flow through these transistors— and therefore the switching speed of the push-pull stage of the CMOS differential amplifier—can be increased. This makes it possible to use the CMOS differential amplifier, for example, in the input stages of clock pulse distribution circuits which distribute clock signals in the 1 GHz range. Furthermore, a more favorable relation between the transistor surface area and the current that can be drawn by the transistors is achieved.

According to a further embodiment of the CMOS differential amplifier according to the invention, both the first voltage divider and the second voltage divider each contain a resistor controlled by means of the bias voltage to ensure the stabilization of even the MOS FETs (MP3, MP4, MN3, MN4) whose gate connections are no longer directly connected to the fed-back bias voltage, in the case of changes in the process conditions, the temperature or the supply voltage.

BRIEF DESCRIPTION OF THE DRAWINGS

Embodiments of the invention are described below, with reference to the accompanying drawings, wherein.

DETAILED DESCRIPTION OF THE ERRED EMBODIMENTS

Figure 1:
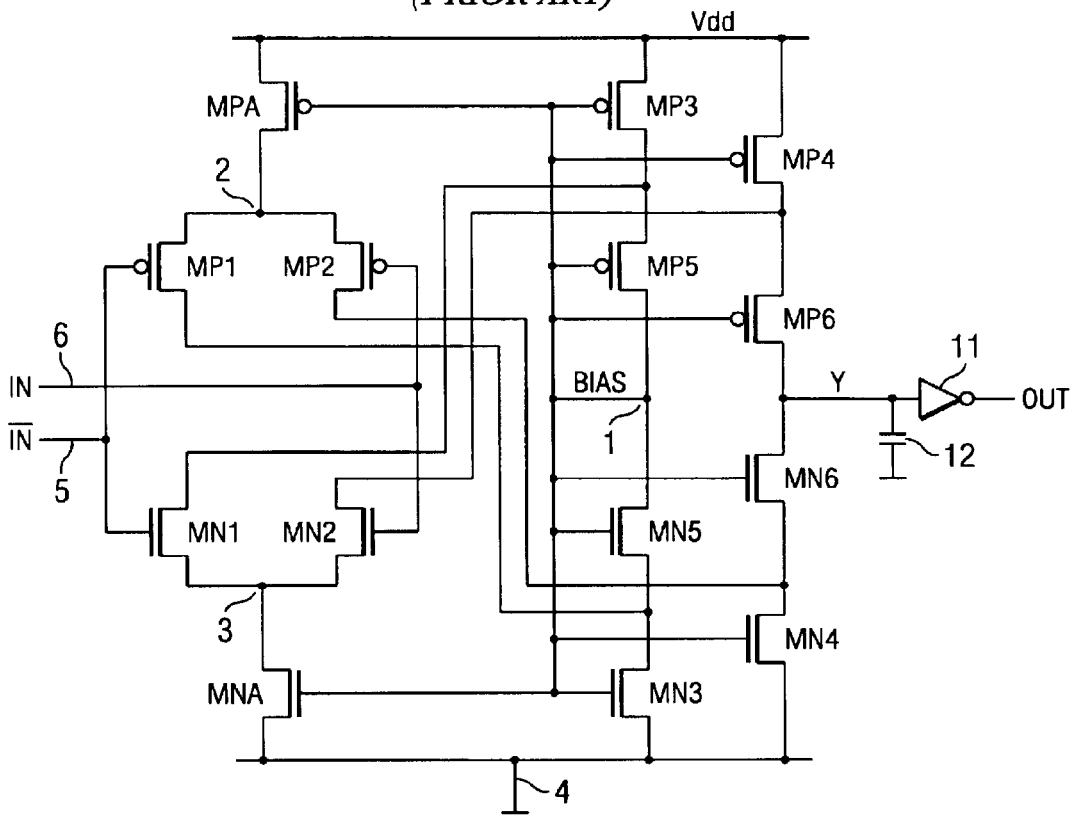
FIG. 1 (prior art) is a circuit diagram of a known CMOS differential amplifier according to the prior art.

FIG. 1 shows a known CMOS differential amplifier according to the prior art, as described by Mel Bazes. Such a conventional CMOS differential amplifier serves to transform two differential input signals IN 6 and $\overline{\text{IN}}$ 5 into an amplified unsymmetrical OUT signal, known as a single-ended signal. The illustrated CMOS differential amplifier is embodied as a rail-to-rail amplifier, wherein in-phase control is possible from the operating voltage Vdd down to the ground potential. The amplifier comprises two MOS FET differential pairs with two PMOS FETs MP1, MP2 and two NMOS FETs MN1, MN2 at its input, to which the input signals IN and $\overline{\text{IN}}$ are applied. The MOS FETs MPA (PMOS FET) and MNA (NMOS FET) act as current sources and are also stabilized by the bias voltage BIAS applied to their gate connections. At the output of the CMOS differential amplifier is a cascode arrangement consisting of eight further MOS FETs whose gate connections are all at bias voltage potential BIAS.

The conventional CMOS differential amplifier of FIG. 1 has in a first cascode branch a series-connected arrangement, comprising a first PMOS FET MP3, a second PMOS FET MP5, a first NMOS FET MN5 and a second NMOS FET MN3, connected between the supply voltage Vdd and ground 4. The gate connections of the four MOS FETs MP3, MP5, MN5 and MN3 are connected to a first circuit node 1, where the drain connection of the second PMOS FET MP5 is connected to the drain connection of the first NMOS FET MN5, and where the bias voltage BIAS is generated. A second cascode branch of the conventional CMOS differential amplifier comprises a series-connected arrangement of a third PMOS FET MP4, a fourth PMOS FET MP6, a first NMOS FET MN6 and a second NMOS FET MN4, connected between the supply voltage Vdd and ground potential 4. The gate connections of the four MOS FETs MP4, MP6, MN6 and MN4 are also connected to the first circuit node 1 and, therefore, to the bias voltage BIAS. The circuit node Y at which the drain connection of the fourth PMOS FET MP6 is connected to the drain connection of the third NMOS FET MN6 forms the output of the CMOS differential amplifier, which is followed by an inverter 11 at whose output a non-inverting output signal OUT is generated. Connected to the input of the inverter is a capacitance 12 (corresponding to the input capacity of the inverter), which is re-polarized before the inverter switches over. The speed of re-polarization of the capacitance 12 determines the operational speed of the CMOS differential amplifier.

As shown in FIG. 1, the conventional CMOS differential amplifier furthermore has a fifth PMOS FET MPA at its input, which acts as a current source and which is connected between the first voltage Vdd and a second circuit node 2, and a fifth NMOS FET MNA, which acts as a current source and which is connected between a third circuit node 3 and the second voltage potential 4. The gate connections of both the current source MOS FETs MPA and MNA are also connected to the bias potential BIAS appearing at node 1. Sixth and seventh PMOS FETs MP1, MP2 and sixth and seventh NMOS FETs MN1 and MN2 are provided for reception of the inputs IN and $\overline{\text{IN}}$ to the amplifier. The sixth PMOS FET MP1 is connected between the second circuit node 2 and the circuit node where the source connection of the first NMOS FET MN5 is connected to the drain connection of the second NMOS FET MN3. The sixth NMOS FET MN1 is connected between the circuit node at which the drain connection of the first PMOS FET MP3 is connected to the source connection of the second PMOS FET MP5, and to the third circuit node 3. The gate connections of the sixth PMOS FET MP1 and the gate connection of the sixth NMOS FET MN1 are connected to the first differential input $\overline{\text{IN}}$ 5 of the CMOS differential amplifier, to which is applied a digital inverted input signal. The seventh PMOS FET MP2 is connected between the second circuit node 2 and the circuit node where the source connection of the third NMOS FET MN6 is connected to the drain connection of the fourth NMOS FET MN4. The seventh NMOS FET MN2 is connected between the circuit node where the drain connection of the third PMOS FET MP4 is connected to the source connection of the fourth PMOS FET MP6, and the third circuit node 3. The gate connection of the seventh PMOS FET MP2 and the gate connection of the seventh NMOS FET MN2 are connected to the second differential input IN 6 of the CMOS differential amplifier, to which is applied a digital non-inverted input signal.

In operation, the CMOS differential amplifier of FIG. 1 receives non-inverted and inverted digital input signals IN and $\overline{\text{IN}}$ at its differential inputs 6 and 5 and delivers at its output a digital output signal OUT.

Initially it is assumed that both differential pairs MP1, MP2 and MN1, MN2 operate within their operating ranges, that is that the in-phase voltages of the input signals are between 1 V and (Vdd-1V). If at both the differential inputs of the CMOS differential amplifier the signal IN switches from the L to the H level and, consequently, the inverted signal $\overline{\text{IN}}$ switches from the H to the L level, MP1 starts to turn on and MP2 to cut off, which means that a more pronounced gradual current increase takes place through the branch Vdd-MPA-MP1-MN3-ground than through the branch Vdd-MPA-MP2-MN4-ground. As a consequence, the drain-source potential of the second NMOS FET MN3 rises, which in turn causes the bias voltage present at the first circuit node 1 to rise. The rising bias voltage causes the gate voltage, and therefore also the gate-source voltage, of the fourth NMOS FET MN4 to rise, whereby this opens up more and more to allow a current to flow from the circuit node Y, to which the input capacitance 12 of the output inverter 11 is connected, to ground, and the inverter 11 switches over at its output as soon as a certain re-polarization of the original charge towards ground potential has taken place.

This effect is still enhanced by the other input branches of the CMOS differential amplifier with NMOS FETs MN1 and MN2. If at both the differential inputs of the CMOS differential amplifier the signal IN changes from the L to the H level and, consequently, the inverted signal $\overline{\text{IN}}$ from the H to the L level, MN2 starts to conduct and MN1 to block, which means that the current flowing through the branch MN2 and MN4 gradually increases in comparison with that through the branch MN1 and MN3. This causes the drain-source voltage of the second NMOS FET MN3 to rise, which in turn causes the bias voltage BIAS to rise. As a result of the rising bias voltage, there is a rise of the gate voltage and therefore also of the gate-source voltage of the fourth PMOS FET MP4, causing this to close more, to reduce the current flow from Vdd to the circuit node Y, which is connected to the input capacitance 12 of the output inverter 11. This is instrumental in aiding the re-polarization of the input of the inverter Y towards ground potential.

The circuit behaves in reverse mode when the input signal IN changes from the H to the L level.

If the in-phase input voltage is outside the operating range of any one of the differential pairs MP1, MP2 or MN1, MN2, that is either<1 V or>(Vdd-1V), only the respective other differential pair will be operational and the switching speed of the CMOS differential amplifier is correspondingly reduced, since the other differential pair cannot contribute towards the re-polarization of the circuit node 4.

A disadvantage of the CMOS differential amplifier represented in FIG. 1 is that the cascode transistors MP3, MP4, MN3 and MN4 are connected to the supply voltage and to ground potential, and by reason of the fact that all cascode transistors MP3, MP4, MP5, MP6, MN3, MN4, MN5 and MN6 are connected at their gate connection to the bias voltage, they can only operate within their resistive range and not in their saturation range (=pinch-off range), which slows the CMOS differential amplifier down, because switching over within the resistive range is slow on account of the low current-carrying capability of the transistors. With reference to the MOS FETs MN6 and MN4 it shall be explained, by way of example, why the MOS FET MN4 can operate only in its resistive range.

As is evident from FIG. 1, the following relationship obtains in the first instance:

$$Vgs(MN6)=Vgs(MN4)-Vds(MN4) \tag{1}$$

where Vgs(MN6) is the gate-source voltage of the NMOS FET MN6, Vgs(MN4) is the gate-source voltage of the NMOS FET MN4, and Vds(MN4) is the drain-source voltage of the NMOS FET MN4.

As is known, the condition for the NMOS FET MN4 to operate in its saturation range is:

$$Vds(MN4) >= Vgs(MN4) - Vth \qquad (2)$$

where Vth is the threshold voltage of the NMOS FETs.

If the equation (1), reduced according to Vds(MN4), is inserted into the equation (2), the condition for the operation of MN4 in its saturation range is: Vgs(MN6)<=Vth, meaning that MN4 can only operate in its saturation range when the NMOS FET MN6 is just only activated, a condition that can, of course, not be realized in practical terms, especially when considering that the bias voltage changes constantly. Therefore, the NMOS FET MN4 of the differential amplifier according to state-of-the-art technology has to operate within its resistive range. The same is applicable in analogue fashion to the cascode transistors MP4, MP3 and MN3.

Figure 2:
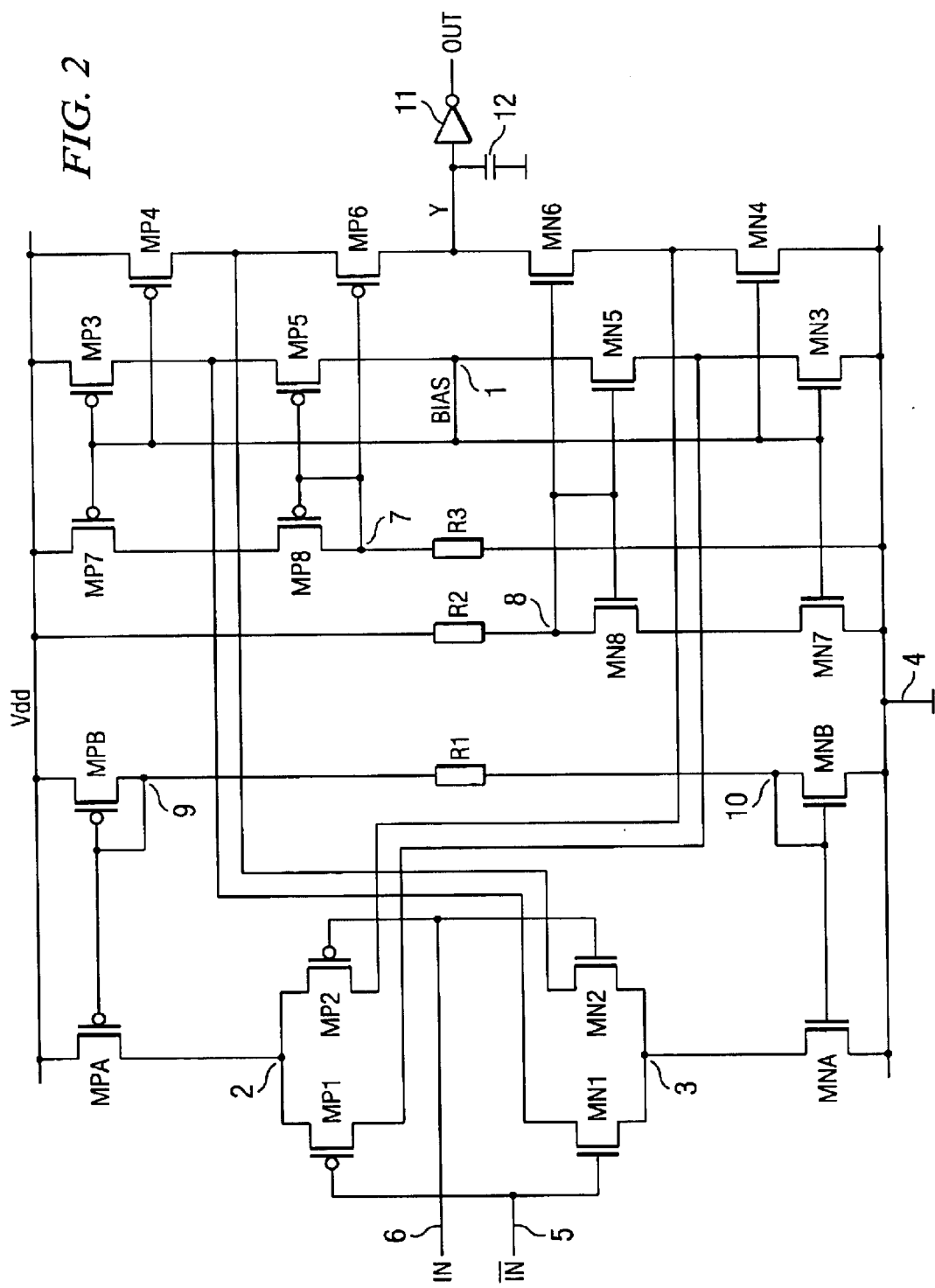
FIG. 2 is a diagram of a preferred embodiment of a CMOS differential amplifier according to the invention.

FIG. 2 represents a first embodiment example of a CMOS differential amplifier according to the invention, which, as compared with the CMOS differential amplifier represented in FIG. 1, has some additional component parts and modified connections. Many of the operational processes of the CMOS differential amplifier of FIG. 2 are similar to those of the CMOS differential amplifier of FIG. 1, so are referred to only to the extent as they are important for understanding the invention. In FIGS. 1 and 2, in other respects, like reference numeral designations are used for the corresponding circuit components.

The CMOS differential amplifier in the example of FIG. 2 is designed so that all of the MOS FETs comprising the cascode circuit (that is, even the MOS FETs MP3, MP4, MN3 and MN4) can operate in their corresponding saturation range. To this end, the gate connections of the MOS FETs MP5, MP6, MN5 and MN6, in contrast to the known CMOS differential amplifier represented in FIG. 1, are not connected to the bias voltage. As in the known circuit, the gate connections of the second PMOS FET MP5 and of the fourth PMOS FET MP6, as well as the gate connections of the first NMOS FET MN5 and of the third NMOS FET MN6 are connected to each other.

A circuit element is furthermore provided that serves to generate a voltage at the gate connection of the second PMOS FET MP6 that is at least as much below the gate voltage of the first PMOS FET MP3 or, respectively, the third PMOS FET MP4 that these can operate within their saturation range, and to generate a voltage at the gate connection of the first NMOS FET MN5, and therefore also at the gate connection of the third NMOS FET MN6, which is at least as much above the gate voltage of the second NMOS FET MN3 or, respectively, the fourth NMOS FET MN4, that these can also operate in their saturation range.

This circuit element can comprise, as in the embodiment example represented in FIG. 2, a first voltage potential divider MP7, MP8, R3, connected between the supply voltage Vdd and the ground potential 4, with a first circuit tapping point 7, which is connected to the gate connection of the second PMOS FET MP5, and a second voltage potential divider R2, MN8, MN7, connected between the supply voltage Vdd and ground potential 4, with a second voltage tapping point 8 that is connected to the gate connection of the first NMOS FET MN5.

In FIG. 2 it can be seen that the first voltage divider MP7, MP8, R3 contains a series connection comprising an eighth PMOS FET MP7, a ninth PMOS FET MP8, connected to act as a diode, and a resistor R3, whereby the gate connections of the second PMOS FET MP5 and of the fourth PMOS FET MP6 are connected to the gate connection of the eighth MOS FET MP8, and the gate connection of the eighth PMOS FET MP7 is connected to the bias voltage. This means that the voltage value present at the gate connections of both MP5 and MP6 can also be controlled by changes in the bias voltage, since changing the bias voltage allows the resistance of the eighth PMOS FET MP7 and, therefore, the voltage value present at the first potential tapping point 7 to be set. Variations of process parameters, supply voltage and temperature can also be taken into account with respect to the gate voltages of transistors MP5 and MP6. MP7, MP8 and R3 are chosen such as to generate a voltage at the gate connection of the second PMOS FET MP5 and, therefore, also at the gate connection of the fourth PMOS FET MP6 that is at least as much below the gate voltage of the first PMOS FET MP3 and, respectively, the third PMOS FET MP4 that these can operate within their saturation range during the operation of the CMOS differential amplifier. R3 can, for example, also comprise an NMOS FET connected in diode mode, the gate of which is connected to its drain and to the gate connections of MP5 and MP6.

From FIG. 2 it can furthermore be seen that the second voltage divider R2, MN8, MN7 has a resistor R2, a diode-connected ninth NMOS FET MN8 and an eighth NMOS FET MN7. The gate connections of the first NMOS FET MN5 and the third NMOS FET MN6 are connected to the gate connection of the eighth PMOS FET MN8, and the gate connection of the eighth NMOS FET MN7 is connected to the bias voltage. This means that the voltage value present at the gate connections of MN5 and MN6 can also be controlled by the bias voltage, since changing the bias voltage allows the resistance of the eighth NMOS FET MN7 and, therefore, the voltage value present at the second potential tapping point 8 to be set. Variations of process parameters, supply voltage and temperature can also be taken into account with respect to the gate voltages of transistors MN5 and MN6. R2, MN8 and MN7 are chosen such as to generate a voltage at the gate connection of the first NMOS FET MN5 and, therefore, also at the gate connection of the third NMOS FET MN6 that is at least as much above the gate voltage of the second NMOS FET MN3 and, respectively, the fourth NMOS FET MN4 that these can also operate within their saturation range during the operation of the CMOS differential amplifier. R2 can, for example, also comprise a PMOS FET connected in diode mode, whose gate is connected to its drain and to the gate connections of MN5 and MN6.

The basic operation of the circuit of FIG. 2 is similar to that of the FIG. 1, previously described. One difference, however, is that the cascode transistors MP3, MP4, MN3 and MN4 can now also operate within their saturation range. This makes it possible to achieve a considerably faster re-polarization of the circuit node Y at the input of the inverter 11, and therefore of the input capacitor connected to the inverter 11, since the transistors MP3, MP4, as well as MN3 and MN4 are now able to carry a larger current and therefore achieve a faster re-polarization of the circuit node 4, which means a faster re-polarization of the output signal of the CMOS differential amplifier. This achieves furthermore an improved relationship between surface of these transistors and their current carrying capability, making it possible to embody the circuit in a more compact form.

The increased switching speed of the CMOS differential amplifier of FIG. 2 has a particularly positive effect when used as the input stage in circuits that change or process time-critical signals whose slope edges define specific points in time, and in particular when input signals of very high frequency are to be processed. The CMOS differential amplifier according to the invention is therefore particularly suited for use as an input stage in signal or clock pulse distribution circuits. This makes it possible, for example, to realize clock pulse distribution circuits that can operate at frequencies in the 1 GHz range.

To make it still more suitable for application in such circuits that process time-critical signals, the CMOS differential amplifier of FIG. 2 exhibits yet a further difference with respect to the conventional CMOS differential amplifier of FIG. 1.

In the case of the CMOS differential amplifier of FIG. 1, the gate voltages of the two MOS FETs, that is the fifth PMOS FET MPA and the fifth NMOS FET MNA, constituting the current source for the MOS FET pairs MP1, MP2 and MN1, MN2, were also connected to the bias voltage. As described above with reference to FIG. 1, the bias voltage changes during the operation of the CMOS differential amplifier depending on whether rising or falling signal slopes are present at the inputs IN or $\overline{IN}$ that is changes from the L to the H level or from the H to the L level. The more current MPA or, respectively, MNA receives, the faster is the switching speed of the input stage. This results, therefore, in different switching times for falling or for rising signal slopes, which is undesirable, for example, in clock pulse distribution circuits operating with differential input and output signals, since this may give rise to undesirable delay time skew effects.

In accordance with the CMOS differential amplifier of FIG. 2, the current flowing through the fifth PMOS FET MPA is set by means of a first current mirror MPA, MPB, and the current flowing through the fifth NMOS FET MNA is set by means of a second current mirror MNA, MNB. As a result, the gate voltage of the fifth PMOS FET (MPA) and the gate voltage of the fifth NMOS FET (MNA) are independent of the bias voltage, and there will be no temporal shift between H/L and L/H transitions of the input signals IN or $\overline{IN}$, respectively, as they progress through the CMOS differential amplifier circuit. The CMOS differential amplifier represented in FIG. 2 is therefore better suited for input stage applications in clock pulse distribution circuits and other circuits processing time-critical signals than previously known CMOS differential amplifiers.

According to FIG. 2, the first current mirror MPA, MPB comprises a tenth PMOS FET MPB whose gate is connected to the gate connection of the fifth PMOS FET MPA, its source to the supply voltage Vdd, and its drain to its own gate connection, as well as to a fourth circuit node 9, and the second current mirror MNA, MNB comprises a tenths NMOS FET MNB whose gate is connected to the gate connection of the fifth NMOS FET MNA, its source to the second voltage 4, and its drain to its gate connection, as well as to a fifth circuit node 10, whereby a resistor R1 is connected between the fourth circuit node 9 and the fifth circuit node 10, the value of which determines the current flowing through the fifth PMOS FET MPA as well as that flowing through the fifth NMOS FET MNA.

Figure 3:
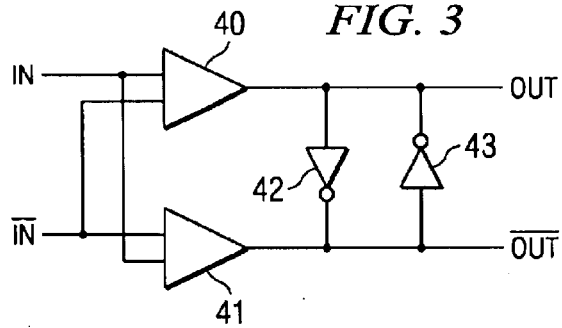
FIG. 3 is a circuit diagram of an input stage of a clock pulse distribution circuit with differential input and output clock signals, which makes advantageous use of the CMOS differential amplifier according to the invention.

If the CMOS differential amplifier according to the invention is used as the input stage of a circuit for the transformation of a differential input signal IN, $\overline{IN}$ into a differential output signal OUT, $\overline{OUT}$, as represented in FIG. 3, where the input stage has a first CMOS differential amplifier 40 according to the invention, which at its output generates a non-inverting output signal OUT, and a second CMOS differential amplifier 41, corresponding to the first CMOS differential amplifier 40, which at its output generates an inverted output signal $\overline{OUT}$, it becomes possible to further reduce any possible temporal shift between the signals OUT and $\overline{OUT}$ in that the outputs of the two CMOS differential amplifiers 40, 41 are connected in each case to the input of an inverter 42, 43 whose output is connected to the output of the corresponding opposite CMOS differential amplifier.

A further embodiment variation of the CMOS differential amplifier according to the invention and represented in FIG. 2 can consist of an arrangement where the gate connections of the MOS FETs MN5, MN6, MP5 and MP6 are each set to a constant DC voltage level by connecting a capacitor to each of them. The result is a "quieter" gate voltage level and the CMOS differential amplifier circuit can achieve even higher switching speeds.

The CMOS differential amplifier according to the invention can operate on a very low supply voltage in the range of 2.2 V and is, for example, extremely well suited as input stage for clock pulse distribution circuits dealing with differential input and output signals, which process LVDS signals and where delay time shifts of less than 50 ps are desirable.

Those skilled in the art to which the invention relates will appreciate that additions, modifications and substitutions can be made to the described embodiments, without departing from the spirit of the invention as described in the specification and set forth in the claims.

I claim:

1. A CMOS differential amplifier comprising a series-connected arrangement consisting of a first PMOS FET, a second PMOS FET, a first NMOS FET and a second NMOS FET, which is connected between a first voltage and a second voltage that is lower than the first voltage, whereby the gate connection of the first PMOS FET and the gate connection of the second NMOS FET are connected to a first circuit node, where the drain connection of the second PMOS FET is connected to the drain of the first NMOS FET, and where a bias voltage is generated;

a series-connected arrangement consisting of a third PMOS FET, a fourth PMOS FET, a first NMOS FET and a second NMOS FET, which is connected between the first voltage and the second voltage, whereby the gate connection of the third PMOS FET and the gate connection of the fourth NMOS FET are connected to the first circuit node, the gate connection of the second PMOS FET to the gate connection of the fourth PMOS FET, and the gate connection of the first NMOS FET to the gate connection of the third NMOS FET, and the circuit node, at which the drain connection of the fourth PMOS FET is connected to the drain connection of the third NMOS FET, forming the output of the CMOS differential amplifier;

a fifth PMOS FET that is connected between the first voltage and a second circuit node;

a fifth NMOS FET that is connected between a third circuit node and the second voltage;

a sixth PMOS FET, connected between the second circuit node and the circuit node at which the source connection of the first NMOS FET is connected to the drain connection of the second NMOS FET;

a sixth NMOS FET connected between the circuit node at which the drain connection of the first PMOS FET is connected to the source connection of the second PMOS FET, and the third circuit node, whereby the gate connection of the sixth PMOS FET and the gate connection of the sixth NMOS FET are connected to a first differential input of the CMOS differential amplifier;

a seventh PMOS FET that is connected between the second circuit node and the circuit node at which the source connection of the third NMOS FET is connected to the drain connection of the fourth NMOS FET;

a seventh NMOS FET that is connected between the circuit node at which the drain connection of the third PMOS FET is connected to the source connection of the fourth PMOS FET and the third circuit node, whereby the gate connection of the seventh PMOS FET and the gate connection of the seventh NMOS FET are connected to a second differential input of the CMOS differential amplifier; and a circuit for generating a voltage at the gate connection of the second PMOS FET that is at least as much lower than the gate voltage of the first PMOS FET that this can operate in its saturation range, and to generate a voltage at the gate connection of the first NMOS FET that is at least that much higher than the gate voltage of the second NMOS FET that this can operate in its saturation range.

2. A CMOS differential amplifier according to claim 1, whereby the circuit element comprises a first potential divider, connected between the first voltage and the second voltage, with a first circuit node point that is connected to the gate connection of the second PMOS FET, and a second potential divider, connected between the first voltage and the second voltage, with a second voltage tapping point that is connected to the gate connection of the first NMOS FET.

3. A CMOS differential amplifier according to claim 2, whereby the first potential divider and the second potential divider each contain a resistor that is controlled by the bias voltage.

4. A CMOS differential amplifier according to claim 3, whereby the first potential divider furthermore contains an eighth PMOS FET whose gate is connected to the first circuit node and whose source is connected to the first voltage, and the second potential divider furthermore contains an eighth NMOS FET whose gate is connected to the first circuit node and whose source is connected to the second voltage.

5. A CMOS differential amplifier according to claim 4, whereby the first potential divider furthermore comprises a ninth PMOS FET whose source is connected to the drain connection of the eighth PMOS FET, and whose drain connection and whose gate connection are connected to the first voltage tapping point, as well as a first resistor that is connected between the first voltage tapping point and the second voltage, and whereby the second potential divider furthermore comprises a ninth NMOS FET whose source is connected to the drain of the eighth NMOS FET, and whose drain connection and whose gate connection are connected to the second voltage tapping point, as well as a second resistor connected between the first voltage and the second voltage tapping point.

6. A CMOS differential amplifier according to one of the previous claims, whereby the gate voltage of the fifth PMOS FET and the gate voltage of the fifth NMOS FET are independent from the bias voltage.

7. A CMOS differential amplifier according to claim 6, whereby the current flowing through the fifth PMOS FET is determined by a first current mirror, and the current flowing through the fifth NMOS FET is set by a second current mirror.

8. A CMOS differential amplifier according to claim 7, whereby the first current mirror comprises a tenth PMOS FET whose gate is connected to the gate of the fifth PMOS FET, whose source is connected to the first voltage and whose drain is connected to its own gate, as well as to a fourth circuit node, and whereby the second current mirror comprises a tenth NMOS FET whose gate is connected to the gate of the fifth NMOS FET, whose source is connected to the second voltage, and whose drain is connected to its own gate, as well as to a fifth circuit node, whereby a third resistor is connected between the fourth circuit node and the fifth circuit node, the value of which determines the current flowing through the fifth PMOS FET and the current flowing through the fifth NMOS FET.

9. A CMOS differential amplifier according to claim 1, the output of which is connected to an inverter.

10. A CMOS differential amplifier according to claim 1 whereby the second voltage is at the ground potential of 0 V.

* * * * *